(12) United States Patent
Shabbir et al.

(10) Patent No.: US 10,390,463 B2
(45) Date of Patent: Aug. 20, 2019

(54) BACKFLOW PREVENTION FOR COMPUTING DEVICES

(71) Applicant: Dell Products, L.P., Round Rock, TX (US)

(72) Inventors: Hasnain Shabbir, Round Rock, TX (US); David L. Moss, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 468 days.

(21) Appl. No.: 14/066,850

(22) Filed: Oct. 30, 2013

(65) Prior Publication Data
US 2015/0116929 A1 Apr. 30, 2015

(51) Int. Cl.
*H05K 7/20* (2006.01)

(52) U.S. Cl.
CPC ..... *H05K 7/20736* (2013.01); *H05K 7/20836* (2013.01)

(58) Field of Classification Search
CPC .......... H05K 7/20736; H05K 7/20836
USPC .......................................... 700/300
See application file for complete search history.

(56) References Cited

U.S. PATENT DOCUMENTS

| | | | | |
|---|---|---|---|---|
| 6,826,456 B1* | 11/2004 | Irving | ............ | G06F 1/20 361/695 |
| 2009/0088873 A1* | 4/2009 | Avery | ............ | G06F 1/206 700/51 |
| 2010/0100254 A1* | 4/2010 | Artman | ............ | H05K 7/20836 700/299 |
| 2012/0026686 A1* | 2/2012 | Suzuki | ............ | F24F 11/0001 361/689 |
| 2012/0136488 A1* | 5/2012 | Tan | ............ | H05K 7/20836 700/278 |
| 2012/0140402 A1* | 6/2012 | Mizumura | ............ | H05K 7/20836 361/679.33 |
| 2014/0355201 A1* | 12/2014 | Alshinnawi | ............ | H05K 7/20736 361/679.47 |

* cited by examiner

*Primary Examiner* — Thomas C Lee
*Assistant Examiner* — Alan Chu
(74) *Attorney, Agent, or Firm* — Fogarty LLP (57) ABSTRACT

Embodiments of the invention are directed to methods and systems for backflow prevention for computing devices. In an embodiment, a system of sensors, processors, and airflow stimulation devices, such as fans, are used to prevent backflow of high temperature gasses through a server housing. The backflow of high temperature gasses may be a result of a pressure differential between a region in which cooling gasses are disposed and a region in which high temperature exhaust gasses are disposed.

19 Claims, 10 Drawing Sheets

BACKFLOW PREVENTION FOR COMPUTING DEVICES

TECHNICAL FIELD

Embodiments of the invention are generally directed computer systems and, more specifically to backflow prevention for servers.

BACKGROUND

Internal circuitry of computers can generate substantial amounts of heat. This is particularly so with rack-mount servers, which are often densely stacked within closed cabinets. As internal temperatures increase, the efficiencies and operating characteristics of internal components change. For example, transistors in processor and memory chip packages may exhibit changing operational characteristics which can lead to thermal runaway that permanently damages or destroys the components.

In order to maintain internal temperatures, most computer systems include one or more fans for cooling internal components. The fans may pump either ambient air or cooled air into the housing of the computer system. For example, a typical desktop computer may draw from ambient air to cool internal components. On the other hand, servers may draw from cooled air because the internal temperatures may be substantially higher than those reached in desktop computers.

Many computer facilities install large air cooling systems which direct cooled air to the servers via sub-floor spaces or specially designed Heating, Ventilation, and Air conditioning (HVAC) systems. In some facilities, cooled air may be piped directly into server rack systems or cabinets through vents in the sub-floor or through dedicated HVAC pipe systems.

In an effort to improve the efficiency of cooling systems, containment systems may be used to separate hot and cold air regions. For example, some systems may include chimney racks, rear door heat exchangers, specially designed containment racks, and aisle containment systems. One drawback of these containment systems is that pressure may build against the natural airflow of the server. During normal operation, the pressure build up is inconsequential to the server, because the normal operation of the server fans counteracts the typical pressure differentials.

By contrast, the pressure differential caused by containment systems can be an issue when a server is in an idle state. During idle state, the server's fan speeds and associated air flow rates are substantially reduced. Testing of a single rack unit (1 U) server suggests that air can start flowing backward at a hindering pressure of 0.08" water (approx. 0.003 psi). Tests show that this value is easily reached in typical containment systems, particularly in a dense rack configuration. Furthermore, stressed systems can generate enough air movement to create high pressure differentials as seem by an idle server in the rack. Typically, the warm temperature blowback would have limited impact on the idle servers, but could have substantial impact on adjacent servers, which may cause fan speeds to increase to a point that would be noticeable by system users. Moreover, system efficiency would be reduced.

SUMMARY

Embodiments of the invention are directed to methods and systems for backflow prevention for computing devices. In an embodiment, a system of sensors, processors, and airflow stimulation devices, such as fans, are used to prevent backflow of high temperature gasses through a server housing. The backflow of high temperature gasses may be a result of a pressure differential between a region in which cooling gasses are disposed and a region in which high temperature exhaust gasses are disposed.

In one embodiment, the method includes detecting an air temperature at a first region of a computing device. The method may also include detecting an air temperature at a second region of a computing device. Additionally, the method may include determining whether the temperature at the first region is higher than the temperature at the second region. In an embodiment, the method also includes adjusting a rate of air flow through a housing of the computing device in response to the determination that the temperature at the first region is higher than the temperature at the second region.

In a further embodiment, the method includes triggering an event in response to the determination that the temperature at the first region is higher than the temperature at the second region. The event may be triggered in response to the temperature of the second region exceeding the temperature of the first region by a difference defined by a predetermined threshold. Adjusting the rate of air flow may be performed in response to triggering of the event.

In an embodiment of the method, adjusting the rate of air flow comprises adjusting a fan speed of a fan device configured to cause air to flow from the first region to the second region. The method may additionally include running the fan device until a second event is triggered. In an embodiment, the second event is the expiration of a predetermined period of time. In another embodiment, the second event is the air temperature at the second region exceeding the air temperature at the first region by a difference defined by a predetermined threshold.

In still a further embodiment, the method may include monitoring the difference between the first region and the second region, determining whether the adjusted rate of air flow reduces the temperature at the first region at a predetermined minimum rate, and increasing the rate of air flow between the first region and the second region in response to a determination that the temperature at the first region has not reduced at the predetermined minimum rate. In such an embodiment, the rate of air flow may be dynamically adjustable according to a dynamically adjustable speed of a fan device configured to cause air to flow from the first region to the second region.

Embodiments of systems are also presented. In one embodiment, the system may include a first temperature sensor configured to detect an air temperature at a first region of a computing device. The system may also include a second air sensor configured to detect an air temperature at a second region of a computing device. Additionally, the system may include a processing device coupled to the first temperature sensor and the second temperature sensor, the processing device configured to determine whether the temperature at the first region is higher than the temperature at the second region, and adjust a rate of air flow through a housing of the computing device in response to the determination that the temperature at the first region is higher than the temperature at the second region.

BRIEF DESCRIPTION OF THE DRAWINGS

Having thus described the invention in general terms, reference will now be made to the accompanying drawings, which are not necessarily drawn to scale, and wherein:

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Figure 1A:
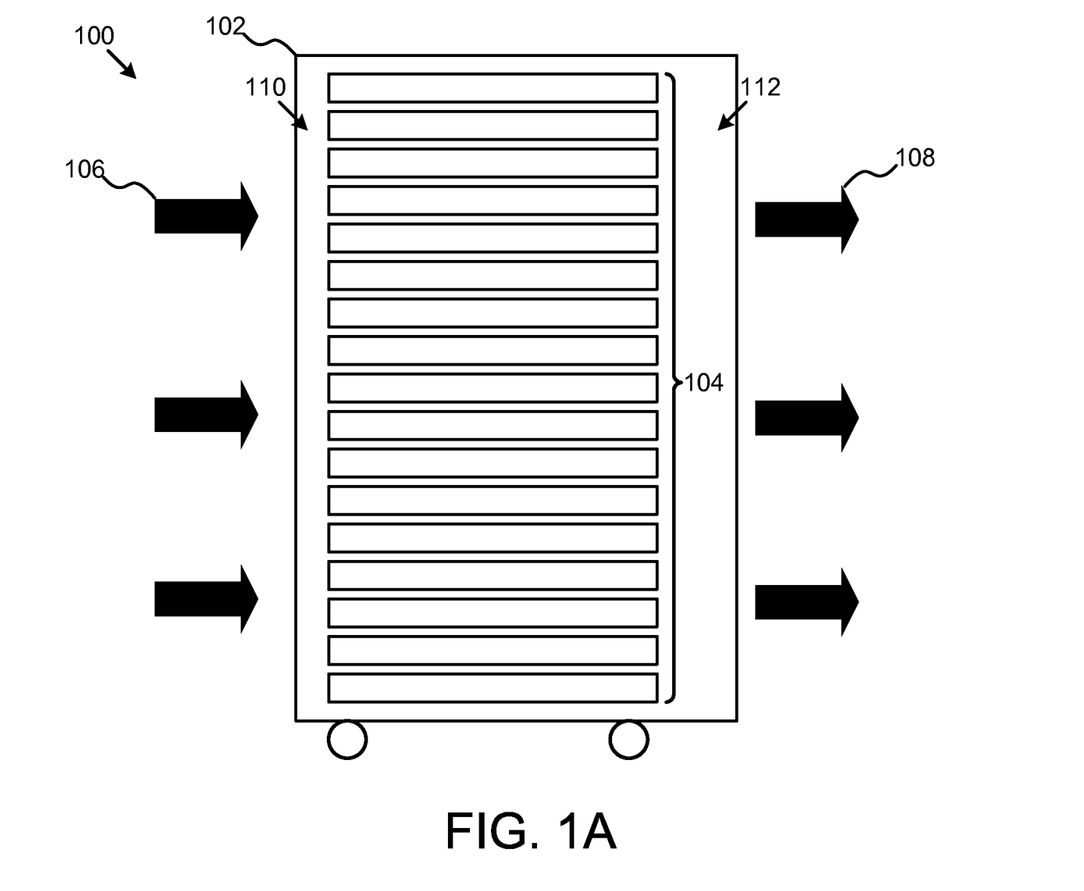
FIG. 1A is a schematic block diagram illustrating one embodiment of a server cooling system.

FIG. 1A is a schematic block diagram illustrating one embodiment of a server cooling system 100. In such an embodiment, the system 100 may include a server rack 102. In certain embodiments, the server rack 102 may comprise a cabinet or enclosure. The server rack 102 may include a plurality of computing devices 104. In an embodiment, the computing devices 104 may be servers. In an embodiment, the server rack 102 may be arranged to allow airflow through the computing devices 110. For example, inflow 106 of cold air may be provided for flowing into the computing devices 104 and outflow 108 of exhaust gasses may flow out of the computing devices 104. In this embodiment, a negative or low pressure region 110 may form at the inflow 106 and a positive or high pressure region 112 may form at the outflow 108.

Figure 1B:
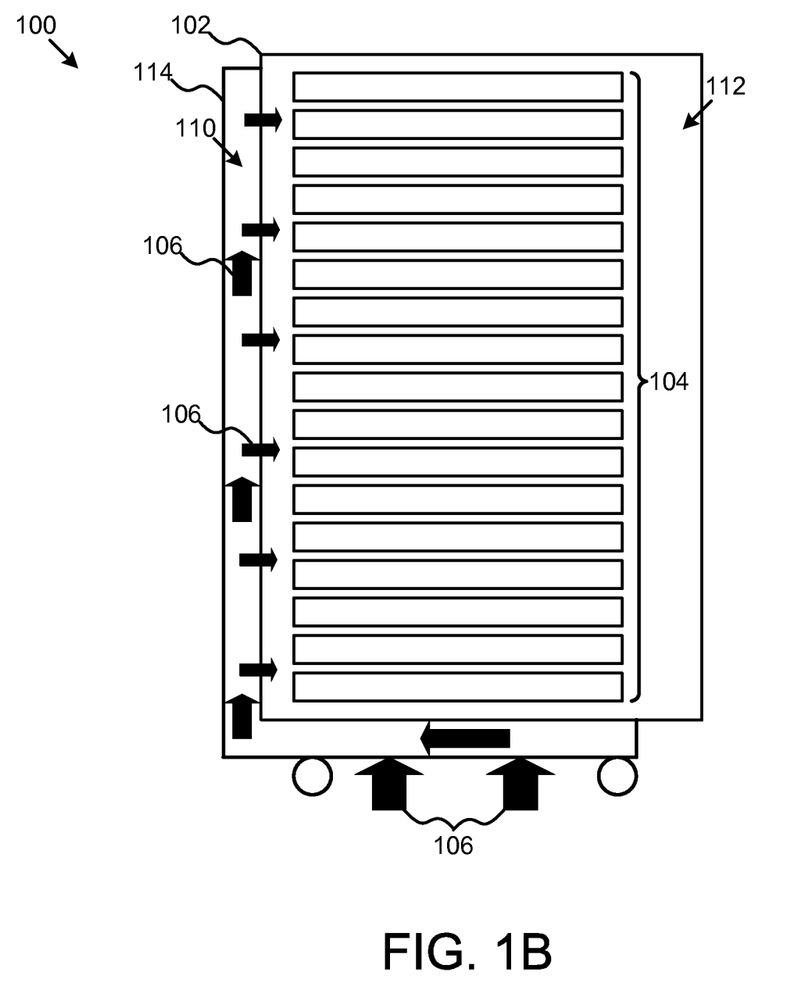
FIG. 1B is a schematic block diagram illustrating another embodiment of a server cooling system.

FIG. 1B is a schematic block diagram illustrating another embodiment of a server cooling system 100. In such an embodiment, the server rack 102 may be configured with a plenum device 114. In an embodiment, the plenum device 114 may be configured to concentrate inflow 106. For example, the plenum device 114 may be coupled to an air handling system of a computing facility. In such an example, a pressure differential between the negative pressure region 110 and the positive pressure region 112 may be increased.

Figure 1C:
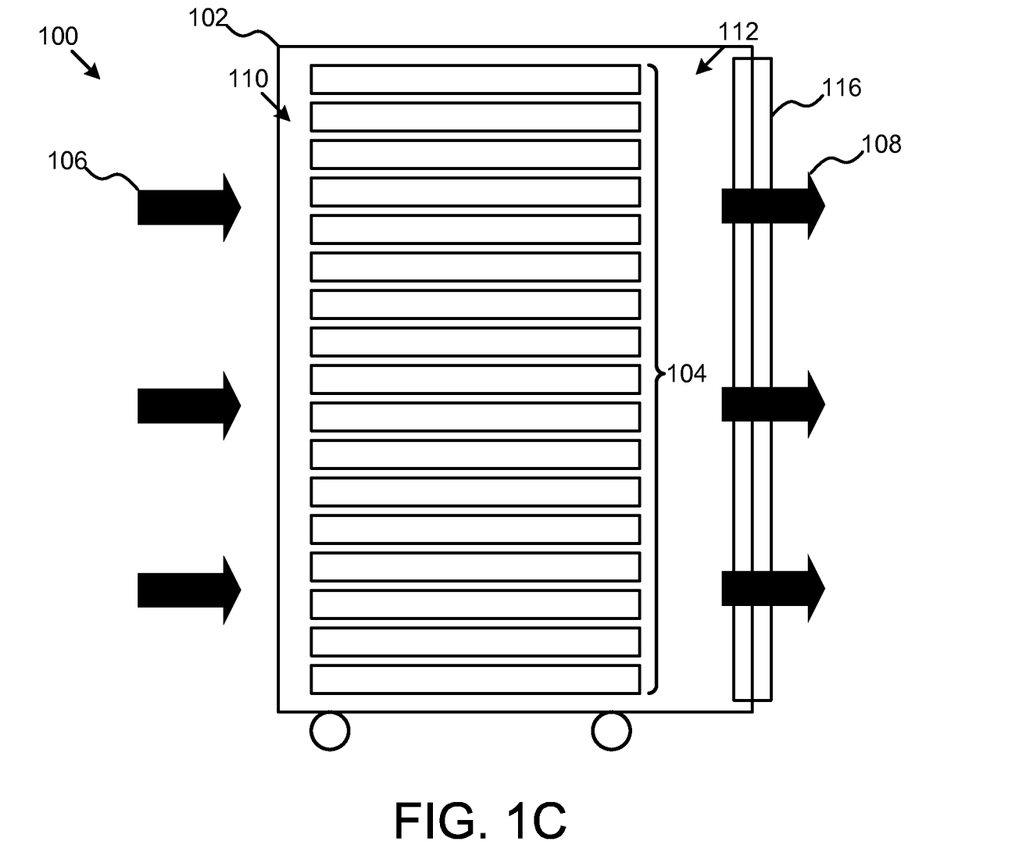
FIG. 1C is a schematic block diagram illustrating another embodiment of a server cooling system.

FIG. 1C is a schematic block diagram illustrating another embodiment of a server cooling system 100. In this embodiment, a heat exchanger device 116 may be positioned in the region of the outflow 108 to remove heat from the exhaust gasses. In this embodiment, a pressure differential between the negative pressure region 110 and the positive pressure region 112 may also exist.

Figure 2:
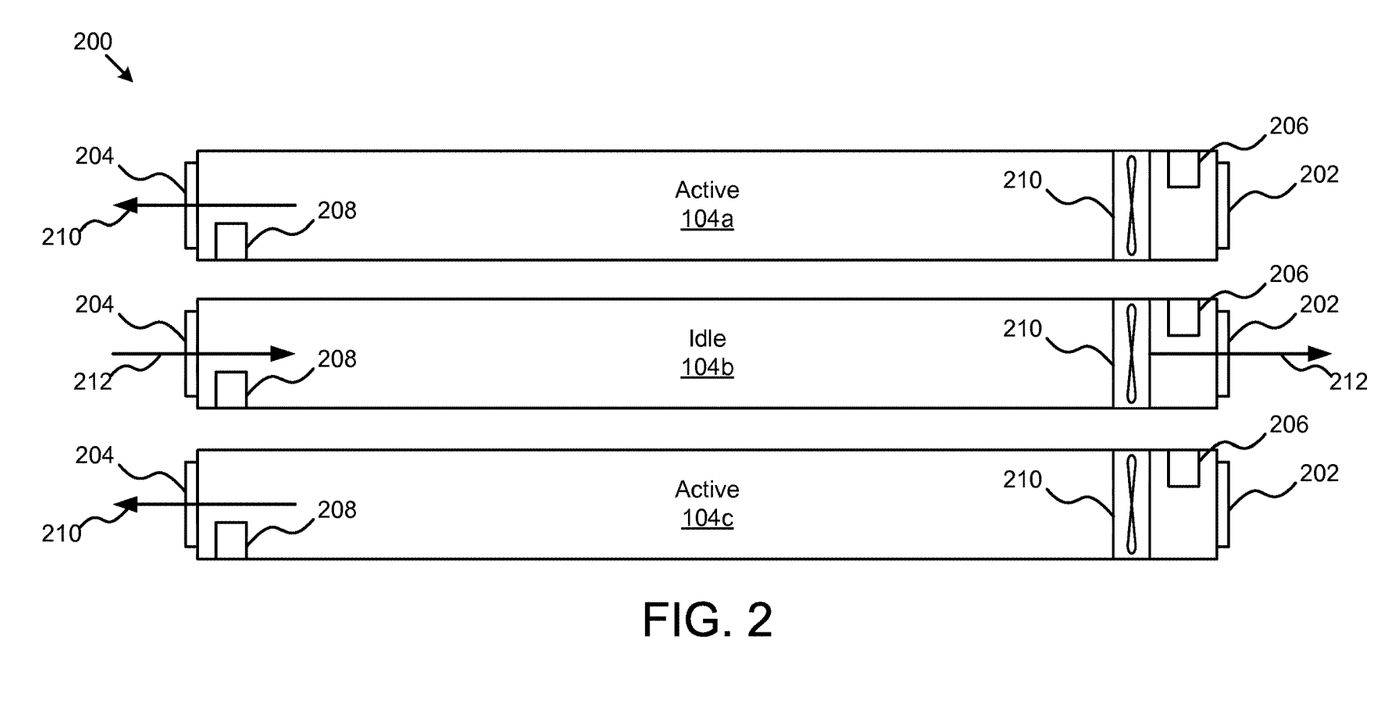
FIG. 2 is a schematic block diagram illustrating an embodiment of a server rack configuration.

FIG. 2 is a schematic block diagram illustrating an embodiment of a server rack configuration 200. In the depicted embodiment, a plurality of computing devices 104a-c may be arranged in, for example, a stack. Although the computing devices are depicted with gaps for ease of illustration, one of ordinary skill will recognize that the computing devices 104a-c may be disposed without gaps to avoid airflow between the computing devices 104a-c.

Each computing device 104a-c may include an air inlet 202 and an air outlet 204. One or more upstream sensors 206 may be positioned at the air inlets 202 and one or more downstream sensors 208 may be positioned at the air outlets 204. Additionally, each computing device 104a-c may include a fan device 210 configured to create airflow between the air inlet 202 and the air outlet 204.

In the depicted embodiment, computing devices 104a and 104c may be in an active state and computing device 104b may be in an idle state. In such an embodiment, when the computing device 104 is in an active state, the fan 210 may spin at a higher rate than when the computing device is in an idle state. When the fans 210 operate at a higher rate, the outflow 210 may increase. In such an embodiment, the pressure differential between the inlet 202 and the outlet 204 may increase such that the airflow created by the fan 210 of the idle computing device 104b is insufficient to counteract backflow 212. In such an embodiment, the outflow 210 of the active computing devices 104a and 104c may create backflow 212 through the idle computing device 104b, thereby increasing the internal temperature of computing device 104b.

Figure 3:
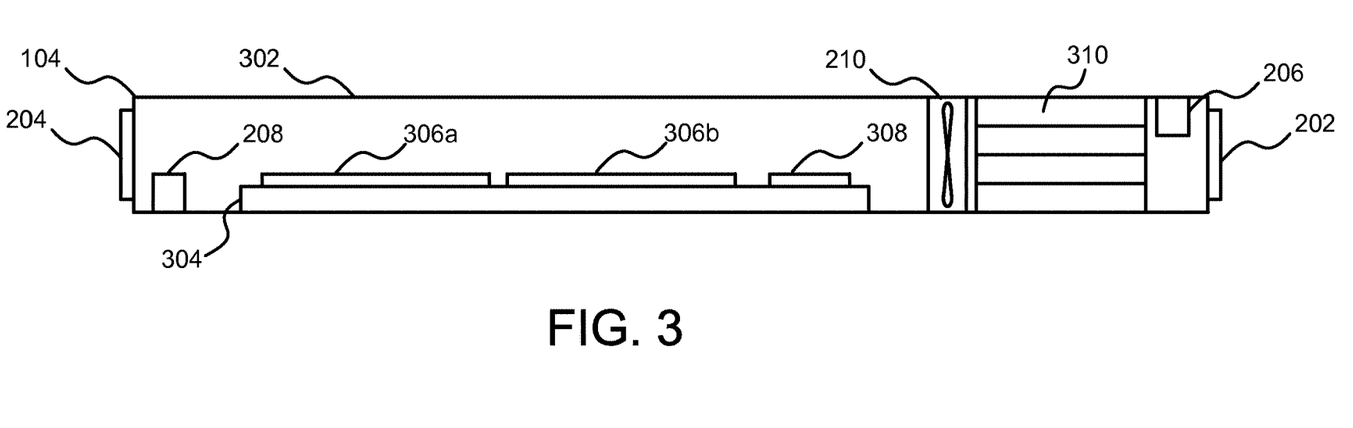
FIG. 3 is a schematic block diagram illustrating one embodiment of a computing device.

FIG. 3 is a schematic block diagram illustrating a computing device 104 according to the present embodiments. In such an embodiment, the computing device 104 may include a housing 302. The housing 302 may include an inlet 202 and an outlet 204. One or more upstream sensors 206 may be disposed in a region near the inlet 202 and one or more downstream sensors 208 may be disposed in a region near the outlet 204. The fan 210 may be positioned to generate airflow from the inlet 202 to the outlet 204.

Additionally, the computing device 104 may additionally include one or more circuit cards 304, such as a motherboard or server backplane. In a particular embodiment, a circuit card 304 may include one or more processing devices 306a-b. Additionally, the computing device 104 may include a control device 308. The control device 308 may be coupled to the one or more upstream sensors 206 and/or the one or more downstream sensors 208. Additionally, the control device 308 may be coupled to the fan 210. In still further embodiments, the computing device 104 may include and/or be coupled to one or more data storage devices 310, such as a disk drive.

For purposes of this disclosure, a computing device 104 may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, a computing device 104 may be a server (e.g., blade server or rack server), a network storage device, or any other suitable device and may vary in size, shape, performance, functionality, and price. A computing device 104 may include Random Access Memory (RAM), one or more processing resources such as a Central Processing Unit (CPU) 402 or hardware or software control logic, Read-Only Memory (ROM), and/or other types of nonvolatile memory.

Additional components of the computing device 104 may include one or more disk drives 310, one or more network ports for communicating with external devices as well as various Input/Output (I/O) devices, such as a keyboard, a mouse, touchscreen, and/or a video display. A computing device 104 may also include one or more buses operable to transmit communications between the various hardware components.

Figure 4:
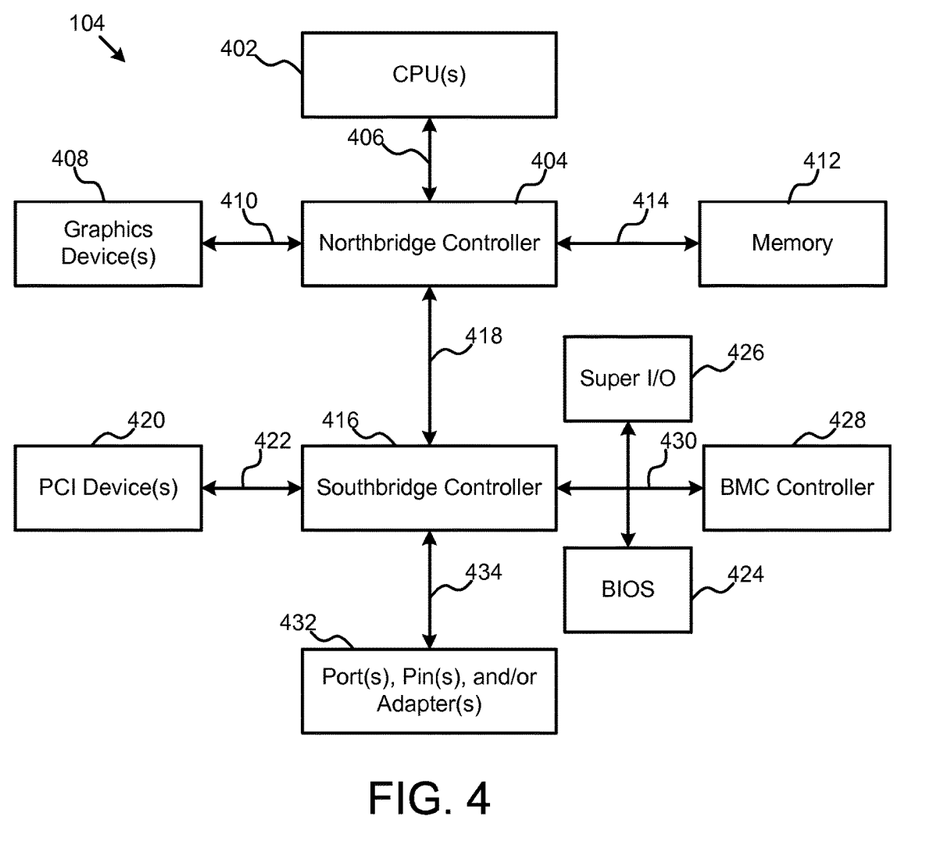
FIG. 4 is a block diagram of an example of an Information Handling System (IHS) according to some embodiments.

To further illustrate the foregoing, FIG. 4 is a block diagram an example of an IHS according to some embodiments. As shown, computing device 104 includes one or more CPUs 402. In various embodiments, computing device 104 may be a single-processor system including one CPU 402, or a multi-processor system including two or more CPUs 402 (e.g., two, four, eight, or any other suitable number). CPU(s) 402 may include any processor capable of executing program instructions. For example, in various embodiments, CPU(s) 402 may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of CPU(s) 402 may commonly, but not necessarily, implement the same ISA.

CPU(s) 402 are coupled to northbridge controller or chipset 404 via front-side bus 406. Northbridge controller 404 may be configured to coordinate I/O traffic between CPU(s) 402 and other components. For example, in this particular implementation, northbridge controller 404 is coupled to graphics device(s) 408 (e.g., one or more video cards or adaptors, etc.) via graphics bus 410 (e.g., an Accelerated Graphics Port or AGP bus, a Peripheral Component Interconnect or PCI bus, etc.). Northbridge controller 404 is also coupled to system memory 412 via memory bus 414. Memory 412 may be configured to store program instructions and/or data accessible by CPU(s) 402. In various embodiments, memory 412 may be implemented using any suitable memory technology, such as static RAM (SRAM), synchronous dynamic RAM (SDRAM), nonvolatile/Flash-type memory, or any other type of memory.

Northbridge controller 404 is coupled to southbridge controller or chipset 416 via internal bus 418. Generally speaking, southbridge controller 416 may be configured to handle various of computing device 104's I/O operations, and it may provide interfaces such as, for instance, Universal Serial Bus (USB), audio, serial, parallel, Ethernet, etc., via port(s), pin(s), and/or adapter(s) 432 over bus 434. For example, southbridge controller 416 may be configured to allow data to be exchanged between computing device 104 and other devices, such as other IHSs attached to a network. In various embodiments, southbridge controller 416 may support communication via wired or wireless general data networks, such as any suitable type of Ethernet network, for example; via telecommunications/telephony networks such as analog voice networks or digital fiber communications networks; via storage area networks such as Fiber Channel SANs; or via any other suitable type of network and/or protocol.

Southbridge controller 416 may also enable connection to one or more keyboards, keypads, touch screens, scanning devices, voice or optical recognition devices, or any other devices suitable for entering or retrieving data. Multiple I/O devices may be present in computing device 104. In some embodiments, I/O devices may be separate from computing device 104 and may interact with computing device 104 through a wired or wireless connection. As shown, southbridge controller 416 is further coupled to one or more PCI devices 420 (e.g., modems, network cards, sound cards, video cards, etc.) via PCI bus 422. Southbridge controller 416 is also coupled to Basic I/O System (BIOS) 424, Super I/O Controller 426, and Baseboard Management Controller (BMC) 428 via Low Pin Count (LPC) bus 430.

BIOS 424 includes non-volatile memory having program instructions stored thereon. Those instructions may be usable CPU(s) 402 to initialize and test other hardware components and/or to load an Operating System (OS) onto computing device 104. As such, BIOS 424 may include a firmware interface that allows CPU(s) 402 to load and execute certain firmware, as described in more detail below. In some cases, such firmware may include program code that is compatible with the Unified Extensible Firmware Interface (UEFI) specification, although other types of firmware may be used.

BMC controller 428 may include non-volatile memory having program instructions stored thereon that are usable by CPU(s) 402 to enable remote management of computing device 104. For example, BMC controller 428 may enable a user to discover, configure, and manage BMC controller 428, setup configuration options, resolve and administer hardware or software problems, etc. Additionally or alternatively, BMC controller 428 may include one or more firmware volumes, each volume having one or more firmware files used by the BIOS' firmware interface to initialize and test components of computing device 104.

Super I/O Controller 426 combines interfaces for a variety of lower bandwidth or low data rate devices. Those devices may include, for example, floppy disks, parallel ports, keyboard and mouse, temperature sensor and fan speed monitoring, etc. For example, the super I/O controller 426 may be coupled to the one or more upstream sensors 206 and to the one or more downstream sensors 208.

In some cases, computing device 104 may be configured to access different types of computer-accessible media separate from memory 412. Generally speaking, a computer-accessible medium may include any tangible, non-transitory storage media or memory media such as electronic, magnetic, or optical media—e.g., magnetic disk, a hard drive, a CD/DVD-ROM, a Flash memory, etc. coupled to computing device 104 via northbridge controller 404 and/or southbridge controller 416.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

A person of ordinary skill in the art will appreciate that computing device 104 is merely illustrative and is not intended to limit the scope of the disclosure described herein. In particular, any computer system and/or device may include any combination of hardware or software capable of performing certain operations described herein. In addition, the operations performed by the illustrated components may, in some embodiments, be performed by fewer components or distributed across additional components. Similarly, in other embodiments, the operations of some of the illustrated components may not be performed and/or other additional operations may be available.

For example, in some implementations, northbridge controller 404 may be combined with southbridge controller 416, and/or be at least partially incorporated into CPU(s) 402. In other implementations, one or more of the devices or components shown in FIG. 4 may be absent, or one or more other components may be added. Accordingly, systems and methods described herein may be implemented or executed with other computer system configurations. In some cases, various elements shown in FIG. 4 may be mounted on a motherboard and protected by a chassis or the like.

Figure 5:
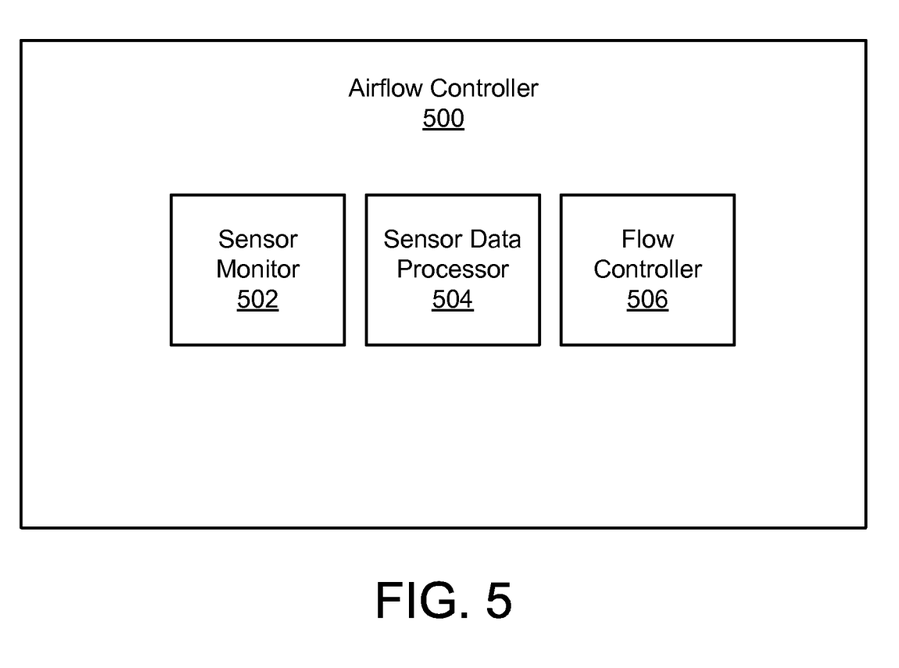
FIG. 5 is a schematic block diagram illustrating an embodiment of an air flow control device.

FIG. 5 is a schematic block diagram illustrating an embodiment of an air flow control device 500. In one embodiment, the air flow control device 500 may include a sensor monitor 502, a sensor data processor 504, and a flow controller 506. In one embodiment, a computing device 104 as shown in FIG. 4, or components thereof, may be used to implement the air flow controller 500. In an embodiment, the air flow control device 500 may be coupled to the one or more upstream sensors 206 and/or the one or more downstream sensors 208. The air flow control device 500 may also be coupled to the fan 210, in one embodiment.

In general, the air flow control device 500 may operate to monitor information obtained from the one or more upstream sensors 206 and from the one or more downstream sensors 208. If the air flow control device 500 determines that the computing device 104 is in a state of backflow, the air flow control device 500 may increase airflow in a direction opposite the backflow.

In an embodiment, the sensor monitor 502 may be configured to read data from one or more of the upstream sensors 206 and the downstream sensors 208. For example, the upstream sensor 206 and the downstream sensor 208 may be configured to provide a DC signal at a level indicative of information collected by the sensor 206, 208. For example, sensors may include temperature sensors configured to provide a signal indicative of a temperature in a region adjacent the sensor 206, 208. One of ordinary skill will recognized that alternative embodiments may be implemented. For example, alternative sensor configurations may be implemented. Sensors of different types, including sensors configured to provide digital signals, AC signals, or the like may be used. Sensors configured to monitor alternative parameters, such as pressure, air flow direction, and the like may be used. Similarly, sensor monitor 502 may be configured to monitor various signal types, including DC signals, AC signals, digital signals, resistance or impedance levels, capacitor levels, inductor currents etc. In some embodiments, sensor monitor 502 may detect signal differences. For example, the sensor monitor 502 may include a comparator, or the like.

In an embodiment, the sensor data processor 504 may be coupled to the sensor monitor 502. The sensor data processor 504 may operate to obtain data from the sensor monitor 502 and detect a backflow state. If a backflow state is detected, the sensor data processor 504 may trigger one or more events. In another embodiment, the sensor data processor 504 may calculate a new air flow rate that may be required to counteract the backflow state. The sensor data processor 504 may additionally identify parameters that indicate that a backflow state has been averted or otherwise counteracted.

In a specific embodiment, the sensor data processor 504 may trigger a first event if a backflow parameter exceeds a first threshold by a predetermined value. In a further embodiment, the sensor data processor 504 may trigger a second event in response to a determination that the backflow parameter has fallen below a second threshold by a predetermined value. The predetermined values may be selected to provide hysteresis and to avoid rapid cycling at either the first or the second threshold. Examples of processes which the sensor data processor 504 may be configured to carry out are described in greater detail with relation to FIGS. 7-8 below.

In an embodiment, the flow controller 506 may be coupled to the sensor data processor 504. The flow controller 506 may be, for example, a fan motor controller. Alternatively, the flow controller 506 may be an output module or component of the air flow controller 500 which is configured to operate a fan, a power supply operating a fan, or other components of the computing device 104 or of system 100 which may be configured increase an air flow rate in the computing device 104 sufficient to counteract backflow through the computing device 104.

Figure 6:
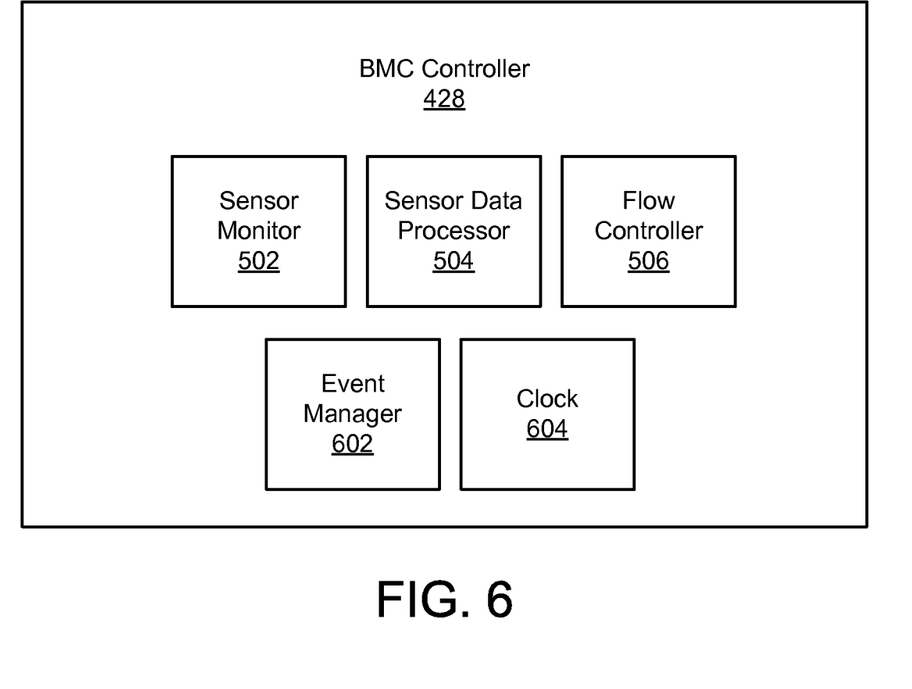
FIG. 6 is a schematic block diagram illustrating another embodiment of an air flow control device.

FIG. 6 is a schematic block diagram illustrating another embodiment of an air flow control device 500. In a specific embodiment, the air flow control device 500 may be implemented in a BMC controller 428. One of ordinary skill in the art will recognize that the air flow controller 500 may be implemented on other processing devices, including other system components or separate stand-alone control components. In an embodiment, the BMC controller 428 may be configured with modules for implementing the sensor monitor 502, the sensor data processor 504 and the flow controller 506, substantially as described with relation to FIG. 5. In a further embodiment, BMC controller 428 may also include an event manager 602 and a clock 604.

In one embodiment, the sensor data processor 504 may trigger an event, which is then handled by event manager 602. Event manager 602 may provide commands, instructions, or other outputs to, for example, flow controller 506. Event manager 602 may further track one or more parameters monitored by sensor monitor 502 to determine whether the event status should be updated, or whether a second event should be triggered. For example, if the sensor data processor 504 determines that the temperature in a region near the upstream sensor 206 is higher than a temperature near the downstream sensor 208, then a first event may be triggered. In response to the first event, the event manager 602 may provide instructions to flow controller 506 according to one or more preset response algorithms. In an embodiment, the instructions may include increasing a fans speed of the fan 210 to increase the flow rate in a direction from the upstream sensor 206 toward the downstream sensor 208.

In an embodiment, the clock 604 may be coupled to the event manager 602 and may provide timing information to the event manager. For example, the event manager 602 may use timing information received from clock 604 to determine whether a predetermined time threshold since triggering either the first event or the second event has elapsed. In an embodiment, the clock 604 may include internal timing circuitry. In another embodiment, the clock 604 may receive timing information from an external clock or timing source.

Figure 7:
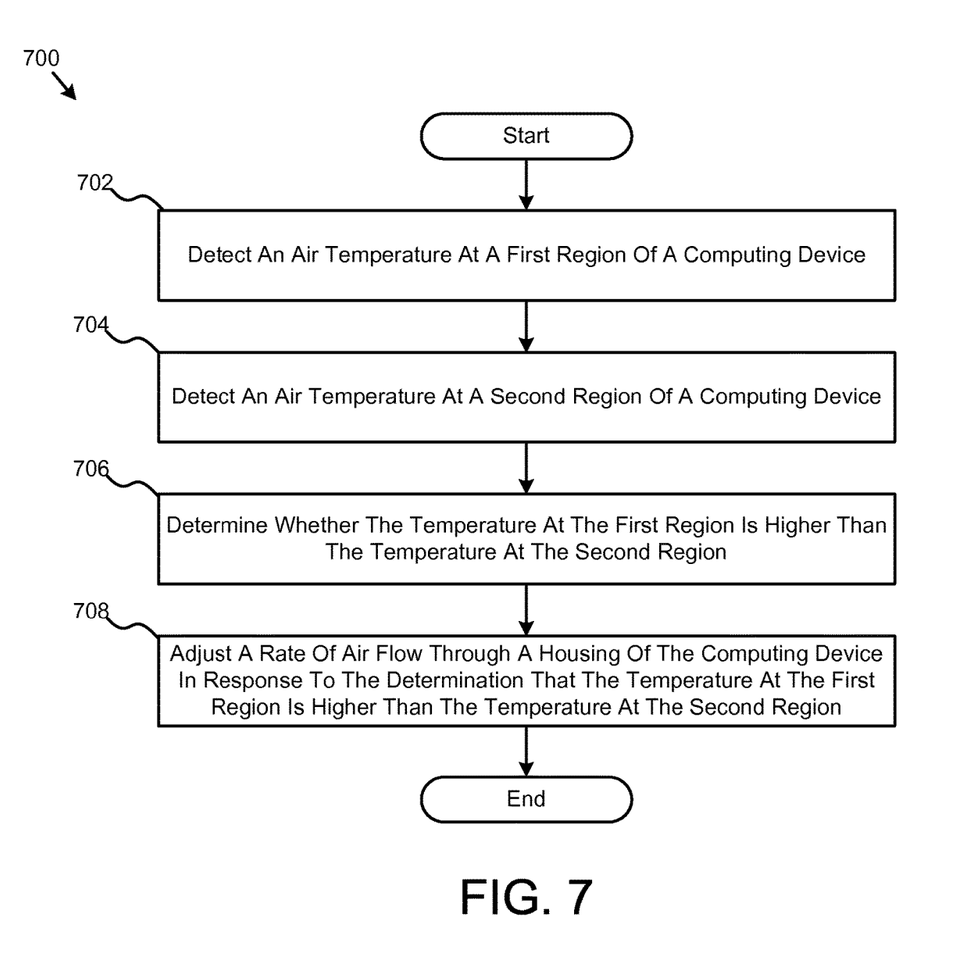
FIG. 7 is a schematic flowchart diagram illustrating one embodiment of a method for backflow prevention for computing devices.
Figure 8:
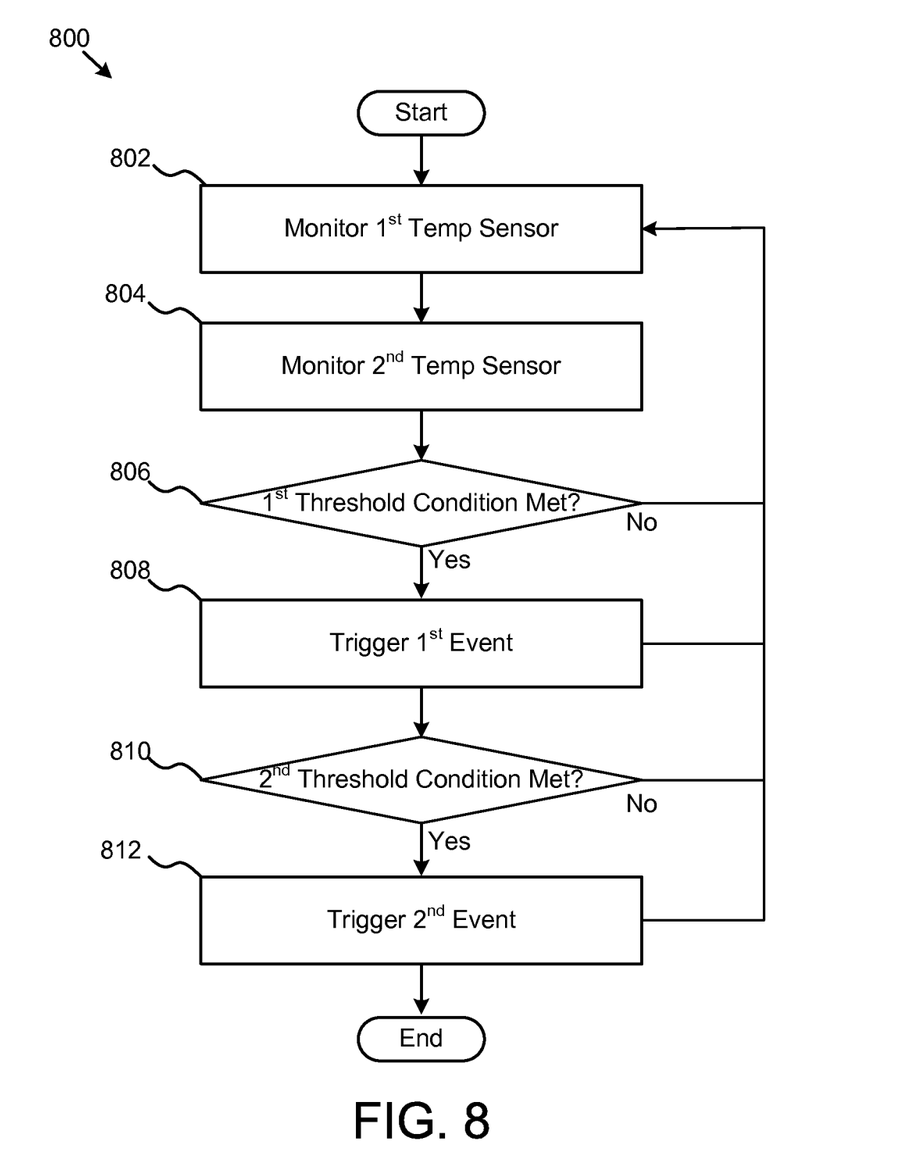
FIG. 8 is a schematic flowchart diagram illustrating another embodiment of a method for backflow prevention for computing devices.

The clock 604, the event manager 602 and other modules 502-506 of the BMC controller 428 may operate to perform one or more steps of methods for backflow prevention, for example as shown in FIGS. 7 and 8.

FIG. 7 is a schematic flowchart diagram illustrating one embodiment of a method 700 for backflow prevention for computing devices 104. In an embodiment, the method 700 starts when the sensor monitor 502 detects an air temperature at a first region of a computing device 104 as shown at block 702. The sensor monitor 502 may also detect an air temperature at a second region of a computing device 104 as shown at block 704. One of ordinary skill will recognize that other parameters may be detected, including for example, a temperature a surface of a physical component of computing device 104, electrical characteristics of components of computing device 104, etc.

The sensor data processor 504 may determine whether the temperature at the first region is higher than the temperature at the second region as shown in block 704. For example, the sensor data processor 504 may include a comparator, implemented either in hardware or in a combination of hardware and software, which is configured to compare the temperature sensed by upstream sensor 206 with the temperature sensed by downstream sensor 208 and determine whether the temperature sensed by upstream sensor 206 is greater than the temperature sensed by downstream sensor 208.

In an embodiment, the method 700 may continue as the flow controller 506 adjusts a rate of air flow through the housing 302 of the computing device 104 in response to the determination that the temperature at the first region is higher than the temperature at the second region, as shown at block 708. For example, the flow controller 506 may include a motor controller or other controller for adjusting a fan speed of the fan 210. In one embodiment, the increased fan speed may be maintained indefinitely. In another embodiment, the increased fan speed may be maintained until the computing device 104 is power cycled. In still another embodiment, the increased fan speed may be maintained until the temperature at the first region falls below the temperature at the second region, indicating that backflow has been successfully counteracted.

FIG. 8 is a schematic flowchart diagram illustrating another embodiment of a method 800 for backflow prevention for computing devices 104. As shown at blocks 802 and 804, the sensor monitor 502 may monitor a first temperature sensor and a second temperature sensor (e.g., upstream sensor 206 and downstream sensor 208 respectively). For example, an upstream sensor 206 may be positioned near an air inlet 202 of the computing device and coupled to BMC controller 428 via Super I/O 426. Downstream sensor 208 may be positioned near an exhaust outlet 204 of the computing device 104 and coupled to BMC controller 428 via Super I/O 426.

At block 806, the sensor data processor 504 may detect a first threshold condition. For example, the sensor data processor 504 may determine that the temperature at the first region has exceeded the temperature at the second region by a predetermined value. In another embodiment, the sensor data processor 504 may determine that the temperature at the first region has exceeded the temperature at the second region for a threshold period of time. In such an embodiment, the sensor data processor 504 may use sensor data from the sensor monitor 502 as well as timing data from the clock 604. One of ordinary skill will recognize that additional threshold conditions may exist which may be of use according to the present embodiments. If the first threshold condition has not been met, the sensor monitor 502 will continue to monitor sensor data 502 and the sensor data processor 504 will continue to check for the condition to be met. If the first threshold condition has been met at block 806, then a first event may be triggered as shown at block 808.

In one embodiment, the event may be triggered by the sensor data processor 504. In another embodiment, the event may be flagged by the sensor data processor but triggered by the event manager 602. One of ordinary skill will recognize that alterative embodiments may exist. The event manager 602 may respond to triggering of the first event in various ways. For example, in response to the event, the event manager 602 may instruct the flow controller 506 to increase the speed of fan 210 to a first level.

If the backflow is successfully counteracted, as indicated by information from the sensor monitor 502, then the event manager may maintain the fan speed for a predetermined period of time as derived from timing information provided by clock 604. If the backflow is not successfully counteracted, the event manager 602 may instruct the flow controller 506 to increase the fans speed again. In one embodiment, the fan speed may be increased in a series of discrete steps. In another embodiment, the fan speed may be increased using a continuously variable speed control.

In still another embodiment, the method 800 may include monitoring the temperature difference between the first region and the second region, determining whether the adjusted rate of airflow reduced the temperature at the first region at a predetermined minimum rate, and increasing the rate of air flow between the first region and the second region in response to the determination that the temperature at the first region has not decreased at the predetermined minimum rate. For example, the flow controller 506 may increase the speed of fan 210 until the temperature sensed by the upstream sensor 206 decreases by a predetermined minimum rate.

In an embodiment, the event manager 602 may determine whether a second threshold condition has been met as shown at block 810. The flow controller 506 may continue to operate the fan at the higher rate of speed until the second event is triggered. In one embodiment, the second event may be triggered after a predetermined period of time after triggering the first event. In another embodiment, the second event may be triggered by the temperature at the upstream sensor 206 falling below the temperature at the downstream sensor 208. In still another embodiment, the second event may be triggered by a combination of time and other events. For example, if the temperature at the upstream sensor 206 falls below the temperature at the downstream sensor 208 for a predetermined period of time. One of ordinary skill may recognize additional criteria for triggering the second event and adjusting the air flow rate through the computing device 104 back to the original rate.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

What is claimed is:

1. A method, comprising:
   in a server rack having computing devices arranged in a stack, determining that at least two of the computing devices are active and at least one of the computing devices is idle, wherein the idle computing device is disposed between the active computing devices and has a fan operating with reduced fan speeds compared to the active computing devices;

detecting an air temperature at a first region of the idle computing device;

detecting an air temperature at a second region of the idle computing device, wherein the first region is physically nearer an air inlet of the server rack than the second region, and wherein the second region is physically nearer an air outlet of the server rack than the first region;

determining that the idle computing device is in a state of backflow, wherein the state of backflow is created by an outflow of the active computing devices through the idle computing device;

calculating an air flow rate configured to counteract the backflow;

using the calculated air flow rate to increase a speed of the fan of the idle computing device in a direction opposite the backflow, and maintaining the increased fan speed until the idle computing device is power cycled; and indicating that the backflow has been counteracted.

2. The method of claim 1, further comprising triggering an event in response to the determination that the temperature at the first region is higher than the temperature at the second region.

3. The method of claim 2, wherein the event is triggered in response to the temperature of the first region exceeding the temperature of the second region by a difference defined by a predetermined threshold.

4. The method of claim 2, wherein increasing the air flow is performed in response to triggering of the event.

5. The method of claim 1, wherein increasing the air flow comprises causing air to flow from the first region to the second region.

6. The method of claim 5, further comprising running the fan until a second event is triggered.

7. The method of claim 6, wherein the second event is the expiration of a predetermined period of time.

8. The method of claim 6, wherein the second event is the air temperature at the second region exceeding the air temperature at the first region by a difference defined by a predetermined threshold.

9. The method of claim 1, further comprising:
monitoring the difference between the first region and the second region; and
increasing the air flow between the first region and the second region in response to a determination that the temperature at the first region has not reduced at a predetermined minimum rate.

10. The method of claim 9, wherein the rate of air flow is dynamically adjustable according to a dynamically adjustable speed of the fan.

11. A system, comprising:
a first temperature sensor configured to detect a temperature at an inlet of a given server housing among a plurality of other server housings stacked within a rack, wherein each of the server housings comprises a respective computing device, wherein a given computing device in the given server housing is in an idle state, wherein at least two other computing devices in at least two other server housings are in an active state, wherein the given server housing is positioned between the at least two other server housings, and wherein the idle computing device has a fan operating with reduced rotating speeds compared to the active computing devices;
a second temperature sensor configured to detect a temperature at an outlet of the given server housing; and
a processing device having program instructions stored thereon that, upon execution, cause the system to:
in response to a difference between the temperature at the inlet and the temperature at the outlet being positive, increase a rotating speed of the fan the given server housing relative to the speed of one or more fans of the at least two other server housings, and maintaining the increased rotating speeds until the idle computing device is power cycled.

12. The system of claim 11, wherein the program instructions, upon execution, further cause the system to identify a backflow event in response to the determination that the temperature at the inlet is higher than the temperature at the outlet.

13. The system of claim 12, wherein the program instructions, upon execution, further cause the system to identify the backflow event in response to a determination that the other two server housings are in a state of outflow.

14. The system of claim 12, wherein the program instructions, upon execution, further cause the system to increase the rotating speed of the fan in response to identification of the backflow event.

15. The system of claim 14, wherein the program instructions, upon execution, further cause the system to run the fan at the increased revolving speed only until a second event is triggered.

16. The system of claim 15, wherein the second event is the expiration of a predetermined period of time.

17. The system of claim 15, wherein the second event is the temperature at the outlet exceeding the temperature at the inlet by a difference defined by a predetermined threshold.

18. The system of claim 11, wherein the program instructions, upon execution, further cause the system to:
monitor the difference between the inlet and the outlet; and
further increase the increased revolving speed of the fan in response to a determination that the temperature at the inlet has been reduced at a rate smaller than a predetermined minimum rate.

19. The system of claim 18, wherein the revolving speed of the fan is dynamically adjustable.

* * * * *